United States Patent [19]

Coldren et al.

[11] 4,117,424
[45] Sep. 26, 1978

[54] ACOUSTIC WAVE DEVICES

[75] Inventors: Larry Allen Coldren, Holmdel;
Alastair Malcolm Glass, Millington;
Ross Alan Lemons, Tinton Falls, all
of N.J.

[73] Assignee: **Bell Telephone Laboratories,
Incorporated,** Murray Hill, N.J.

[21] Appl. No.: 783,056

[22] Filed: Mar. 30, 1977

[51] Int. Cl.² .................. H03H 9/30; H03H 9/04;
H03H 9/26; H04R 17/10
[52] U.S. Cl. ................ 333/30 R; 333/70 T;
333/72
[58] Field of Search .............. 333/30 R, 30 M, 29,
333/71, 72, 70 T; 310/313, 26; 364/821;
365/157

[56] References Cited
U.S. PATENT DOCUMENTS

| | | | |
|---|---|---|---|
| 3,701,122 | 10/1972 | Geusic et al. | 365/157 X |
| 3,840,826 | 10/1974 | Toda et al. | 333/30 R |
| 3,918,012 | 11/1975 | Peuzin | 333/30 R |

OTHER PUBLICATIONS

Toda el al.—"Surface Acoustic Wave Velocities on $Gd_2(MoO_4)_3$" in Applied Physics Letters, vol. 22, No. 10, May 15, 1973; pp. 476–477.

Toda et al. — Variable Delay Devices Using Ferroelastic and Ferroelectric Crystal $Gd_2(MoO_4)_3$ in IEEE Trans. on Sonics and Ultrasonics, vol. SU 20, No. 4, Oct. 1973; pp. 376–379.

*Primary Examiner*—Eugene La Roche
*Assistant Examiner*—Marvin Nussbaum
*Attorney, Agent, or Firm*—Ronald D. Slusky

[57] ABSTRACT

A crystalline body having two or more domains interfacing at respective domain walls is utilized as an acoustic wave device. Input and output transducers and, in some embodiments, acoustic wave reflectors, are disposed on the crystalline body such that the delay experienced, or the path followed, by acoustic waves propagating between the input and output transducers is varied by varying the positions of the domain walls. This, in turn, is accomplished by way of control signals applied across the crystalline body.

18 Claims, 10 Drawing Figures

ACOUSTIC WAVE DEVICES

BACKGROUND OF THE INVENTION

The present invention relates to acoustic wave devices.

Monolithic electronic devices in which information is stored on a slowly propagating surface or bulk acoustic wave have found considerable use in communications, radar and other signal processing systems. Among materials which can be used to advantage in fabricating such devices are crystalline materials in which regions, or domains, interfacing at a so-called domain wall, can coexist stably. For most directions of propagation through the crystal, acoustic waves propagate at different velocities in adjacent domains. In addition, a domain wall can be made to move predictably by applying appropriate electrical control signals to the crystalline body. The crystalline material itself may be, for example, a rare earth molybdate such as terbium molybdate or gadolinium molybdate. In these materials, which are ferroelectric, the application of an electrical control signal along the axis of spontaneous electrical polarization (polar axis) in a region of the material which includes a domain wall effects an interchange of the two nonpolar axes immediately adjacent one side of the domain wall or the other, depending on the control signal polarity. This, by definition, effects the domain wall movement.

The above-described crystallographic properties have been exploited in the prior art to provide a variable delay line for acoustic waves. Input and output transducers for either surface acoustic waves (SAW) or bulk acoustic waves (BAW) are so disposed on the crystalline body that the output transducer receives acoustic waves which have propagated within at least two domains. The delay between the input and output transducers is thus varied by moving the domain wall so as to vary the relative propagational path lengths within the two domains. The control signal is applied to the crystalline body by way of a pair of electrodes disposed on opposite faces thereof, each electrode comprising a homogeneous, low impedance plate which covers substantially the entire face on which it is disposed.

The prior art further teaches that the acoustic device may include a second domain wall between the transducers in order to compensate for acoustic wave refraction at the first domain wall. Since each electrode covers substantially the entire face on which it is disposed, the applied control signal causes both domains to move either towards or away from each other. This can be disadvantageous since the precise position of each wall cannot be accurately controlled. Moreover, special care must be taken to ensure that the walls do not meet each other, in which case the entire body would be transformed into a single domain. It thus may be desirable to have the position of one of the domain walls fixed. To this end, the prior art suggests that a crystal defect be provided at the desired stationary-wall position. There are several drawbacks to this approach, however. For example, it is difficult to provide a crystal defect which is assured to reliably hold the domain wall in place. In addition, fabrication of devices with substantially identical defects to ensure device uniformity in mass production would also be difficult. Moreover, a crystal defect can serve as a nucleation site for further, unwanted domain walls.

SUMMARY OF THE INVENTION

In accordance with a feature of the present invention, at least one of the electrodes is so formed that it covers less than the entire face of the crystalline body on which it is disposed. In particular, any domain wall which is to remain stationary intersects, at most, one electrode and therefore does not respond to control signals applied to the device. The electrode itself may be of the homogenous type known in the art. In accordance with a further feature of the invention, however, it may be comprised of a plurality of low resistivity segments interleaved with relatively high resistivity gaps. Such an electrode arrangement facilitates precise positioning of the domain wall at one of a number of predetermined locations.

In accordance with another feature of the invention, means including a domain wall and associated control circuitry are used to reflect acoustic wave energy to an output transducer in a variable manner. In an illustrative embodiment of a reflection filter, for example, domain walls themselves are used as the medium for reflecting acoustic waves from an input transducer to the output transducer. Reflection occurs at a wall because it represents an impedance discontinuity to acoustic waves. The input/output characteristic of the device is a function of the delay experienced by acoustic waves as they propagate from the input transducer to each domain wall and thence to the output transducer. That characteristic can thus be varied by moving the domain walls since this varies the lengths of the various acoustic wave paths between the transducers. This structure can also be used as a simple delay line by using just one domain wall.

In other devices embodying the invention, the reflecting medium may include at least a first conventional wavelength-selective SAW reflector comprising, for example, a grating etched in the surface of the body along the acoustic wave propagation path. A domain wall is located within the body such that waves passing through the rearward portion of the reflector cross the wall and, accordingly, undergo a change in velocity. The forward and rearward reflector portions are thus adapted to reflect waves within two frequency bands. Such an arrangement is used to advantage to provide a dual passband filter in which varying the location of the domain wall provides a mechanism for concurrently varying the amplitude and phase relationships of the two passbands.

In accordance with another feature of the invention, a SAW or BAW input transducer may be oriented on the crystalline body with respect to the crystal axes such that waves launched at that transducer do not necessarily undergo a change in velocity as they cross the domain wall, but do undergo a change in power flow angle. Establishing the domain wall at one of several predetermined locations thus directs the acoustic waves along different propagational paths. Each path includes a respective transducer. The transducer to which the acoustic wave is directed is thus electronically controlled by applying appropriate signals to the domain wall control electrodes.

Another acoustic wave device embodying the principles of the present invention comprises a variable width waveguide for shear mode bulk acoustic waves. The guide includes a central domain, or channel, of a first crystal orientation, and a pair of outer domains of a second crystal orientation. The velocity of shear mode waves along the length of the channel is lower for the first crystal orientation than for the second. As a result, shear mode waves launched within the channel are, advantageously, contained (guided) therewithin.

BRIEF DESCRIPTION OF THE DRAWING

The invention may be clearly understood from a consideration of the following detailed description and accompanying drawing in which.

DETAILED DESCRIPTION

Figures 1A, 1B:
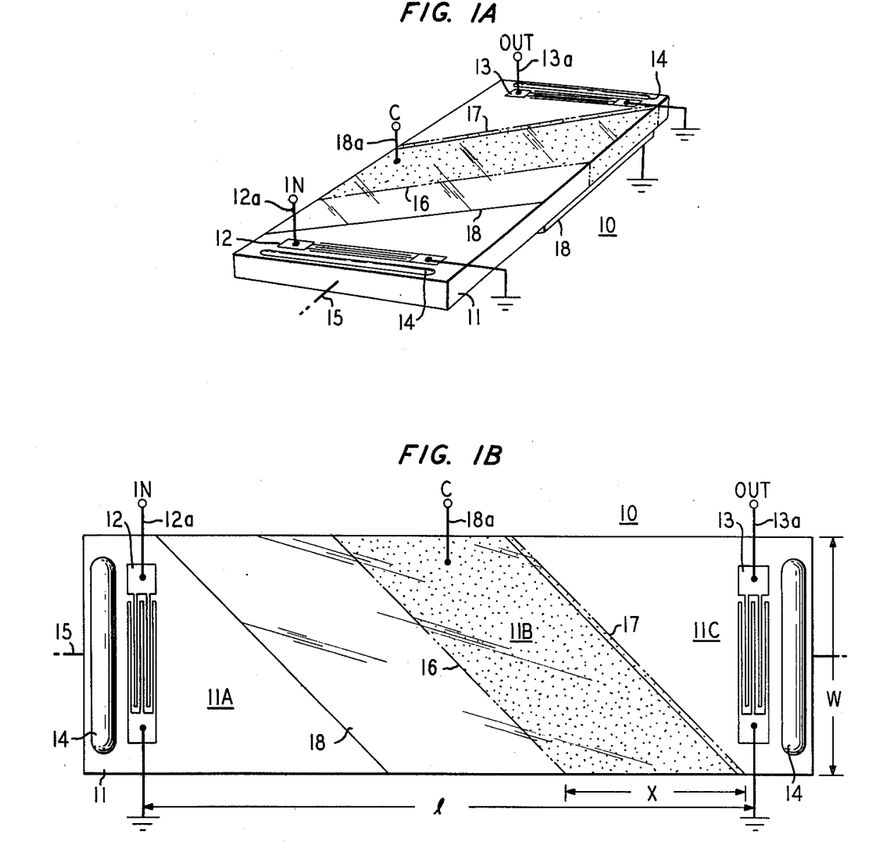
FIGS. 1A and 1B are perspective and top views, respectively, of a surface acoustic wave (SAW) delay line including electrode structure in accordance with the invention.

FIGS. 1A and 1B are perspective and top views, respectively, of a variable delay line 10 which includes electrode structure in accordance with a feature of the invention. Delay line 10 is comprised of a body of crystalline material 11 in which acoustic waves will propagate. A conventional surface acoustic wave (SAW) transducer 12 is disposed on the surface of body 11. Electrical signals to be delayed are received by transducer 12 on input lead 12a. The transducer converts same to acoustic energy, which propagates through body 11 to output SAW transducer 13 along a path which is substantially parallel to delay line axis 15. The latter converts the acoustic energy back to electrical form on output lead 13a. Conventional SAW absorbers 14 disposed at each end of body 11 absorb acoustic wave energy which would otherwise be reflected internally within the device and distort the signals being delayed.

The crystalline material of body 11 is of a type in which regions, or domains, of at least two distinct crystal orientations, interfacing at a so-called domain wall, can coexist stably within the body. Body 11 is illustratively comprised of three domains—11A, 11B and 11C—with the $a$ crystal axis aligned with device axis 15 in domains 11A and 11C and the $b$ crystal axis aligned with the device axis in domain 11B. Domains 11A and 11B interface at domain wall 16; domains 11B and 11C interface at domain wall 17. Walls 16 and 17 are planes demarcating the regions of different crystal axis orientation. The orientation of domain walls 16 and 17 with respect to the crystal axes is a characteristic of the crystalline material selected for body 11 and cannot be varied.

Surface acoustic waves propagate along the $a$ axis of the crystalline material at (illustratively) a slower speed than they propagate along the $b$ axis. Thus, the total delay $\tau$ for surface acoustic waves propagating from transducer 12 to transducer 13 is given by $$\tau = (l - x)/v_a + x/v_b \tag{1}$$

where $l$ is the distance between transducers 12 and 13, $x$ is the distance (measured along the device axis) between domain walls 16 and 17, and $v_a$ and $v_b$ are the velocities at which surface acoustic waves propagate along the $a$ and $b$ crystal axes, respectively. Small effects relating to refraction and anisotropy in domain 11B have been ignored in (1) for simplicity. A further property of the crystalline material of body 11 is that a domain wall can be caused to move to the left or right in a predictable manner by applying an appropriate electrical control signal to the body. This provides an advantageous mechanism for varying $x$ and, therefore, for varying $\tau$.

More particularly, the crystalline material of body 11 may be, for example, a rare earth molybdate such as terbium molybdate $\beta - Tb_2(MoO_4)_3$ or gadolinium molybdate $\beta - Gd_2(MoO_4)_3$. These materials are coupled ferroelastic-ferroelectrics. In these materials the $c$ axis is the polar axis and the $a$, $b$ and $c$ axes always maintain the same relationship to one another following, for example, the right-hand rule. In FIG. 1B the $c$ axis illustratively points out of the plane of the drawing in domains 11A and 11C and into the plane in domain 11B. A further property of these materials is that the application of a control voltage along the $c$ axis across a region of the crystal which includes a domain wall reverses the polarity of the $c$ axis—and therefore effects an interchange of the $a$ and $b$ axes—immediately adjacent one side of the domain wall or the other, depending on the polarity of the applied voltage. This, by definition, effects a movement of the domain wall. The magnitude of the control voltage must be at least equal to a threshold voltage $V_{th}$, which is determined principally by the crystal thickness and the coercive field of the ferroelectric material. Once the wall has been moved to the desired location, the control voltage is removed.

The desired domain wall movement can be accomplished in any of several ways. For example, delay line 10 illustratively includes a pair of electrodes 18 disposed on opposing surfaces of body 11 such that they intersect the plane of domain wall 16. Control signals for varying the location of wall 16 are applied to the upper electrode of electrode pair 18 by way of control lead 18a. The lower electrode of electrode pair 18 is grounded (as is the lower electrode of the electrode pairs in the devices described hereinbelow). The edges of electrodes 18 must extend at least as far as the maximum desired left and right excursions of any point on wall 16. It thus proves convenient to make the electrode edges parallel to the domain walls. Electrodes 18 are illustratively comprised of 300Å thick chromium evaporated onto the surface of body 11.

The control signals applied to lead 18a may be generated, for example, by conventional feedback circuitry, (not shown) which introduces a pilot signal in the electrical input signal, measures the delay experienced by the pilot signal in passing through the device, generates a signal representing the delay, compares that signal to an applied signal representing the desired amount of delay, and generates a feedback control signal on control lead 18a having a polarity which indicates whether the delay is to be increased or decreased. Illustratively, a positive (negative) signal applied to lead 18a moves wall 16 to the left (right), thereby decreasing (increasing) $\tau$. Although the magnitude of the feedback control signal is not crucial (as long as it exceeds $V_{th}$), system stability is improved if that magnitude is related to the difference between the current and desired delays.

Another possibility is to monitor the position of wall 16 optically. The birefringence of the rare earth molybdates, for example, is such that a domain wall can be observed by looking at the crystal along the $c$ axis through crossed polarizers. Establishing the domain wall at the desired location can then be accomplished by a human operator or automatically by way of straightforward optical detection circuitry. See, for example, A. Kumada, "Optical Properties of Gadolinium Molybdate and Their Device Applications," *Ferroelectrics*, Vol. 3, pp. 115–123 (1972).

In some applications it may be required only to specify the amount, $\Delta\tau$, by which $\tau$ is to be changed without regard to its actual value. From (1), $$\Delta\tau = -(\Delta x/V_a) + (\Delta x/V_b) = -\Delta x (V_b - V_a/V_a V_b) \quad (2)$$

where $\Delta x$ represents a change in dimension $x$. Furthermore, it can be shown that $$\Delta x = Q/2(P_s w) \quad (3)$$

where Q is the amount of charge transferred between the upper and lower electrodes of electrode pair 18 in moving wall 16, $P_s$ is the polarization charge per unit area (a parameter of the ferroelectric crystalline material), and $w$ is the width of delay line 10. Substituting (3) into (2) yields $$\Delta\tau = kQ \quad (4)$$

where $k = -(V_b - V_a/2 \, P_s w V_a V_b)$, which is a constant. A desired $\Delta\tau$ can thus be achieved, for example, by applying to the device by way of electrode 18 a pulse from a constant current source of amplitude I and duration T such that Q = IT.

Figure 2:
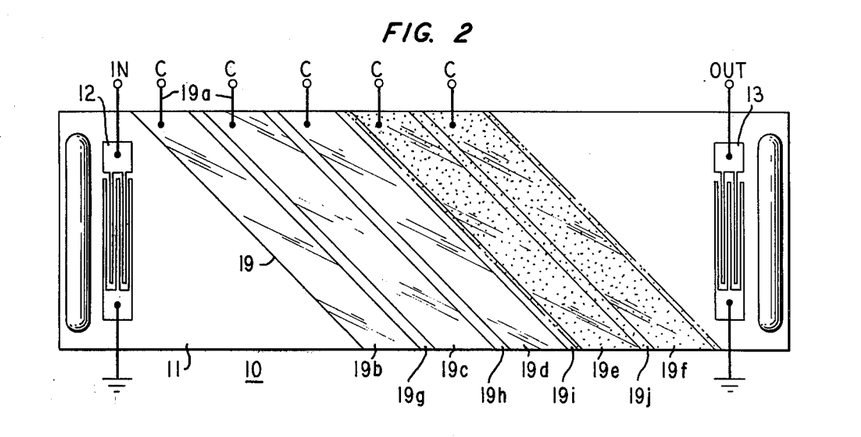
FIG. 2 depicts the delay line of FIGS. 1A and 1B with an alternative control electrode structure in accordance with a feature of the invention.

FIG. 2 shows, in accordance with a feature of the present invention, yet another approach for establishing domain wall 16 at a desired location. Here, the upper electrode of electrode pair 19 is comprised of a plurality of relatively low resistivity, e.g. 20$\Omega$/square, segments 19b–19f interleaved with a plurality of relatively high resistivity, e.g. 10M$\Omega$/square, gaps 19g–19j. This interleaved structure may be fabricated by evaporating a layer of high resistivity material, such as carbon, onto body 11, and then evaporating segments 19b–19f over the carbon. Segments 19b–19f may, again, be comprised of 300Å thick chromium.

Wall 16 is positioned under a selected high resistivity gap, e.g. gap 19h, by applying negative- and positive-polarity signals, each of magnitude greater than $V_{th}$, to the low resistivity segments on either side of it, e.g. segments 19c and 19d. This causes wall 16 to move to the left if it was originally to the right of gap 19h and vice versa. The resistivity of gaps 19g–19j is sufficiently low that the magnitudes of the potentials on segments 19b, 19e and 19f are also all above $V_{th}$. Consistent with this requirement, however, the resistivity of gaps 19g–19j should be made sufficiently high that the power dissipated across a gap when wall 16 is being positioned thereunder is held to an acceptably low level. If it is known that wall 16 is originally to the right (left) of the selected gap, power dissipation can be further minimized by applying a positive- (negative-) polarity signal of magnitude greater than $V_{th}$ to the segment to the immediate right (left) of the selected gap and a signal of the same polarity, but of magnitude just below $V_{th}$, to the segment on the other side of the gap.

It may be noted at this point that, if desired, delay line 10 can be fabricated with only two domains and a single domain wall. For example, wall 17 could be eliminated so that 11B and 11C comprise a single domain in which the $b$ crystal axis is aligned with the device axis. However, the acoustic waves launched at transducer 12 are refracted slightly as they cross wall 16. The presence of wall 17 provides a compensating refraction. Alternatively, output transducer 13 could be set at a compensating angle with respect to the device axis.

Figure 3:
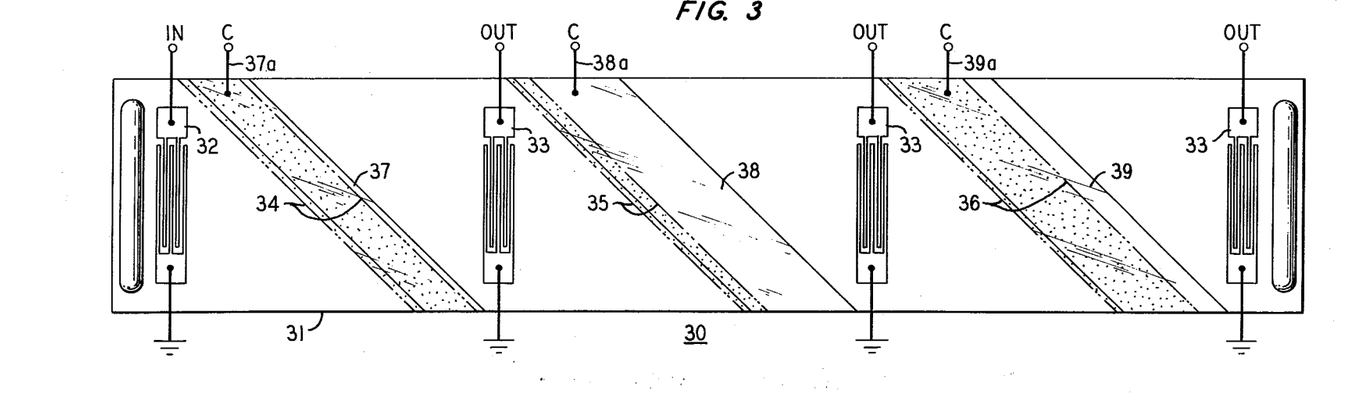
FIG. 3 depicts a SAW transversal filter in accordance with the invention.

FIG. 3 depicts a SAW transversal filter 30 comprising a body of crystalline material 31 of the type described above in connection with delay line 10, an input transducer 32 and a plurality of output transducers 33. An electrical signal to be filtered is applied to transducer 32. The resulting surface acoustic wave propagates through the device, exciting each of output transducers 33 as it goes. The outputs of transducers 33 may be combined in standard fashion by a weighting network (not shown) to provide the filter output signal.

Among the parameters which determine the transfer characteristic of filter 30 are the delays experienced by the acoustic waves as they propagate between successive transducers. These delays have usually been determined principally by the distances between the transducers, and are not easily varied once the device has been fabricated. In accordance with the invention, however, domain wall pairs 34, 35 and 36 and associated control electrode pairs 37, 38 and 39, respectively, are interposed between each pair of transducers. The lower electrode of each electrode pair in filter 30 is not visible in the drawing. (This is also true of the electrode pairs in the devices described hereinafter.) The delay experienced by an acoustic wave as it propagates between any two transducers can thus be varied simply by applying the appropriate signals to control leads 37a, 38a and 39a connected to the upper electrodes of electrode pairs 37, 38 and 39, respectively. The filter delay parameters, and thus its overall characteristic, can thus be easily varied to suit a particular application. Circuitry for setting the walls at desired locations in this device, as in all of the acoustic wave devices of the invention, may comprise one of the arrangements described hereinabove in conjunction with delay line 10 or may comprise any of many alternatives which will be apparent to those skilled in the art.

Figure 4:
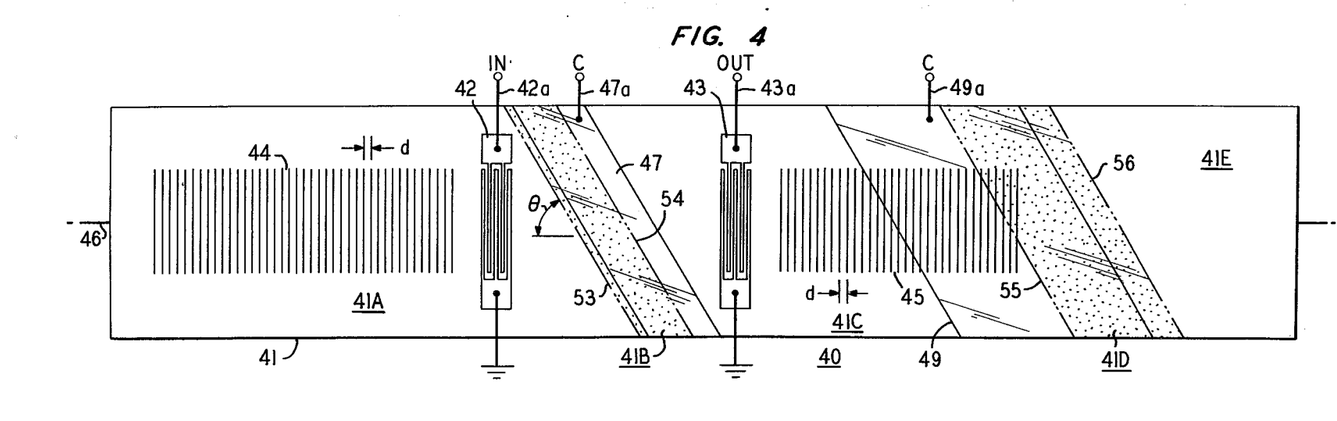
FIG. 4 depicts a SAW resonator in accordance with the invention.

FIG. 4 depicts a SAW resonator 40 comprised of a body of crystalline material 41 of the type described above in conjunction with delay line 10, input and output SAW transducers 42 and 43, respectively, and SAW reflectors 44 and 45. The latter illustratively comprise respective arrays of grooves etched into the surface of body 41.

The principles of operation and design of acoustic wave resonators are discussed in detail in, for example, P. S. Cross et al, "Design and Applications of Two-Port SAW Resonators on YZ-Lithium Niobate," *Proceedings of the IEEE*, Vol. 64, No. 5, pp. 682–685 (May 1976), in Y. Koyamada et al, "Narrow-Band Filters Employing Surface-Acoustic-Wave Resonators," pp. 685–687, of the same issue and in D. T. Bell, Jr. et al, "Surface-Acoustic Wave Resonators," pp. 711–721, of the same issue. Briefly, surface acoustic waves generated by input transducer 42 in response to electrical signals on input lead 42a propagate both to the left into reflector 44 and to the right to output transducer 43. A portion of the SAW energy reaching transducer 43 is converted to electrical form on output lead 43a. The rest passes through transducer 43 to reflector 45.

Reflectors 44 and 45 are substantially invisible to surface acoustic waves outside a relatively narrow wavelength band determined principally by the distance $d$ between the reflector grooves. Thus SAW energy outside that band escapes from the device while SAW energy within the above-mentioned wavelength band is reflected by reflectors 44 and 45 back into the resonator.

Only energy within a still narrower wavelength band actually resonates within the device, providing a narrowband filter transfer characteristic for resonator 40. The precise center wavelength of the passband is principally determined by the time required for surface acoustic waves to propagate between reflectors 44 and 45. This, in turn, is varied in accordance with the invention by providing a central domain 41B between transducers 42 and 43. Domain 41B interfaces with outer domains 41A and 41C at domain walls 53 and 54 respectively. The location of wall 53, and thus the above-mentioned propagation time, are varied by way of a control signal applied to lead 47a connected to the upper electrode of electrode pair 47.

Body 41 may be cut such that the $a$ crystal axis is aligned with device axis 46 in domains 41A and 41C, the $b$ crystal axis, then being aligned with the device axis in domain 41B. Note, however, that the minimum distance between transducers 42 and 43 is limited by the angle $\theta$ between domain wall 53, for example, and device axis 46. In many applications it may be desirable to dispose transducers 42 and 43 relatively close to one another to prevent possible multimoding. In such applications, body 41 will be cut with respect to the crystal axes such that $\theta$ is closer to a right angle. Now neither the $a$ nor $b$ crystal axis will be aligned with device axis 46 in any domain.

Figure 5:
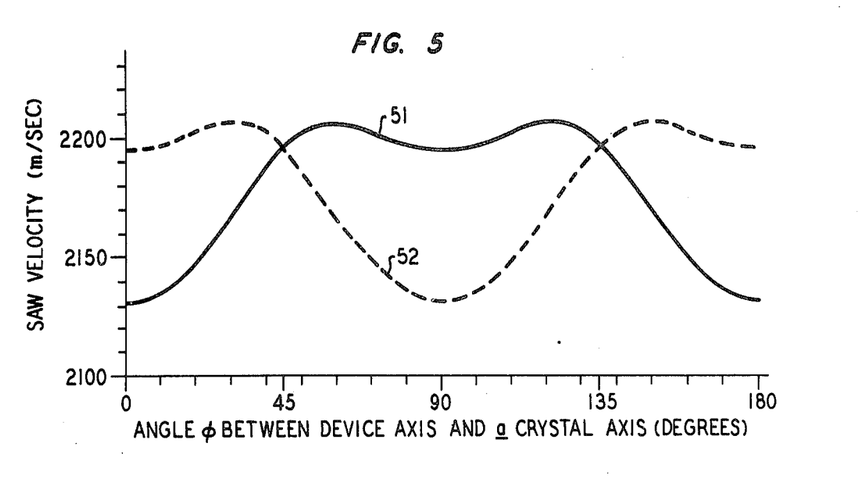
FIG. 5 is a graph helpful in explaining the principles of the invention.

There are some constraints on how body 41 can be cut with respect to the crystal axes. Curve 51 of FIG. 5 shows the velocity of a surface acoustic wave propagating along device axis 46 (assuming that body 41 is comprised of gadolinium molybdate) as a function of the angle $\phi$ between axis 46 and the $a$ crystal axis. In order to ensure that the waves propagating into reflectors 44 and 45 propagate along the device axis rather than sideways out the sides of the reflectors, $\phi$ must be chosen such that the slope of curve 51 for the selected $\phi$ is at or near zero. This illustratively occurs for values of $\phi$ at or near 0°, 60°, 90°, 120°, 180°, etc.

The cut of body 41 also affects the tuning range of resonator 40. Consider curve 52, which is identical to curve 51 but shifted by 90°. Acoustic waves experience a 90° change in orientation with respect to the crystal axes when they cross a domain wall. Thus, the SAW velocities on opposite sides of a domain wall for any selected value of $\phi$ are the ordinate values on curves 51 and 52 which correspond to that value of $\phi$. Some values of $\phi$, e.g., $\phi = 0°, 90°, 180°$, etc., provide the maximum velocity difference. These correspond to a cut in which the $a$ and $b$ axes are aligned with the device axis in the different domains, and provide the maximum range of delay between reflectors 44 and 45, and thus the maximum tuning range for resonator 40. If, however, $\phi$ must have some other value, a smaller tuning range will have to be accepted. The choice of $\phi$ will thus depend on the requirements of the particular application.

Resonator 40 also illustratively includes a domain 41D, which interfaces domains 41C and 41E at domain walls 55 and 56 respectively. A portion of reflector 45 lies under the upper electrode of electrode pair 49 associated with wall 55. Applying a control signal to control lead 49a controls the degree to which reflector 45 lies within domain 41D. This effectively changes the length of the reflector for waves within the resonator passband since those waves have a different velocity, and thus a different wavelength, in domain 41D. This has the effect of lowering the Q of the resonator, i.e., broadening its passband. Moreover, as the effective length of the reflector is shortened (lengthened), more (less) acoustic wave energy within the passband is allowed to escape out the end of reflector 45. This provides an advantageous mechanism for controllably coupling acoustic energy from resonator 40 to, for example, another acoustic wave device.

Figure 6:
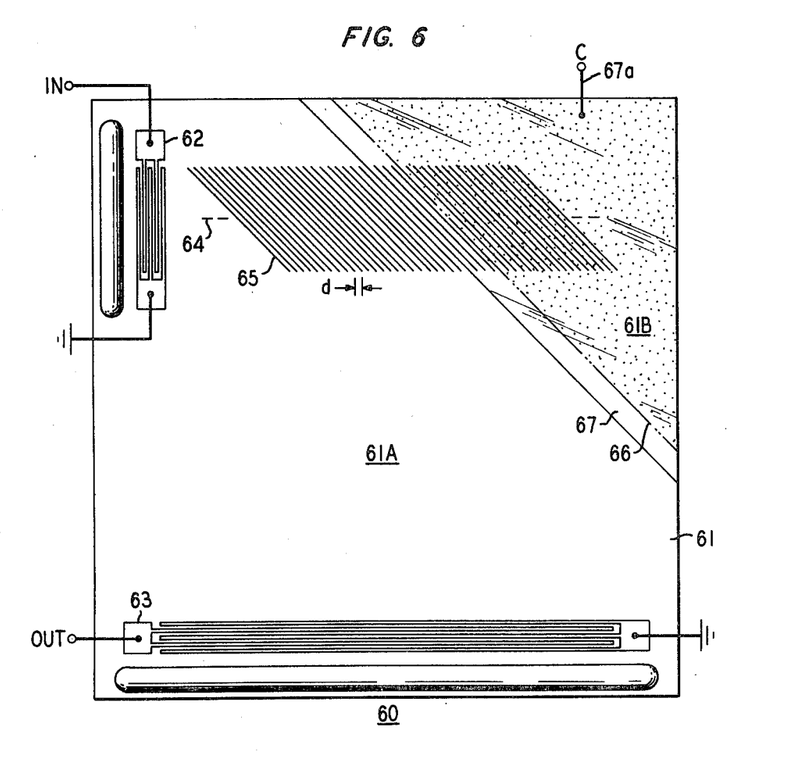
FIG. 6 is a narrowband filter for surface acoustic waves in accordance with the invention.

FIG. 6 depicts a filter 60 comprised of a body of crystalline material 61 of the type described in connection with delay line 10, input and output transducers 62 and 63, respectively, and SAW reflector 65. The latter may be comprised of a plurality of grooves etched in the surface of body 61. The grooves of reflector 65 are separated by a distance $d$. In accordance with the invention, a domain wall 66 having an associated electrode pair 67 divides body 61 into domains 61A and 61B in which the $a$ and $b$ crystal axes, respectively, are aligned with the axis 64 of reflector 65.

The principles of design and operation of SAW reflectors are described in R. C. Williamson, "Properties and Applications of Reflective Array-Devices," in the above-cited publication, pp. 702–710. Briefly, the portion of reflector 65 within domain 61A is transparent to acoustic waves at all but a narrow band of frequencies centered about $f_a = v_a/2d$. Acoustic energy within this narrow frequency band is reflected by reflector 65 to output transducer 63. At the same time, the portion of reflector 65 within domain 61B is transparent to acoustic waves at all but a narrow band of frequencies centered about $f_b = v_b/2d$, which frequencies are also reflected to transducer 63. The transfer characteristic of filter 60 thus comprises two narrow passbands. Advantageous the amplitude and phase relationships of the two passbands are varied by varying the position of wall 66 by way of signals applied to control lead 67a.

Figure 7:
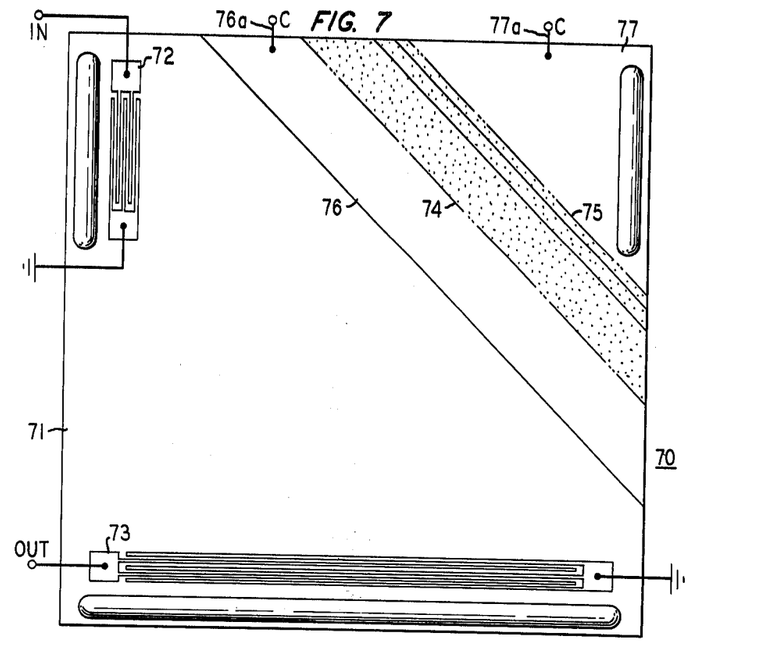
FIG. 7 is a reflection filter for surface acoustic waves in accordance with the invention.

FIG. 7 depicts a SAW reflection filter 70 including a body of crystalline material 71 of the type described above in connection with delay line 10, input transducer 72 and output transducer 73. Filter 70 also includes a plurality of domain walls, illustratively domain walls 74 and 75 having associated control electrode pairs 76 and 77, respectively.

A domain wall represents an impedance discontinuity to acoustic waves. As a result, a portion of the acoustic energy launched at transducer 72 is reflected at wall 74 to output transducer 73. The rest of the energy passes through wall 74, but a portion of that is reflected to transducer 73 at wall 75. The effects of refraction of the acoustic waves as they cross a domain wall are substantially cancelled by a compensating refraction when the waves recross the wall. In addition, the fact that the angle of incidence does not quite equal the angle of reflection at a domain wall can be compensated for by making the angle between transducers 72 and 73 just a little less than 90°, thereby ensuring that the acoustic wavefronts impinging on transducer 73 are parallel thereto. The transfer characteristic of filter 70 is determined, inter alia, by the locations of the domain walls inasmuch as these determine the delays experienced by various frequency components of the signal being filtered. See, for example, the above-cited Williamson paper. Heretofore, the structure providing the desired reflections in filters of this type has been comprised of various gratings disposed at fixed locations on the device. This of course, fixes the filter at a single characteristic. The present invention, by contrast, provides a way of easily varying that characteristic.

Figure 8:
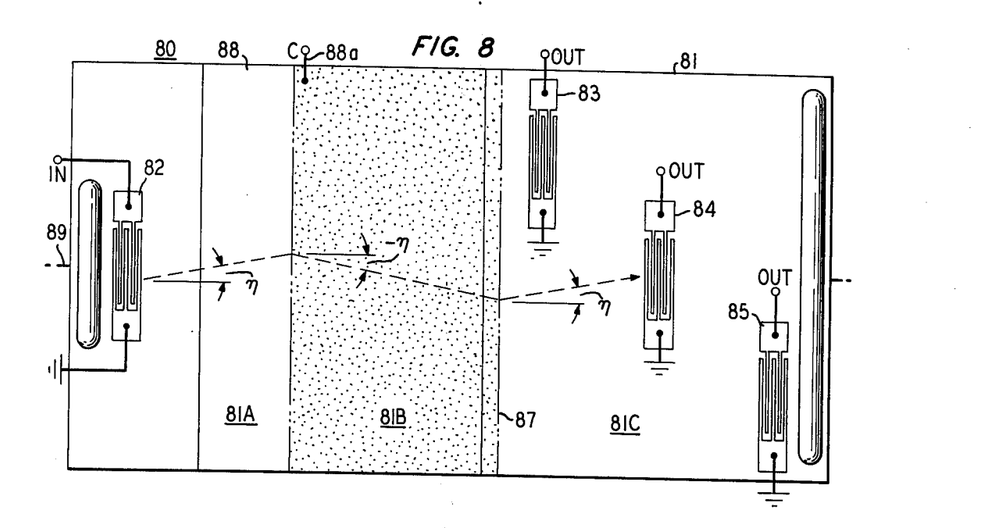
FIG. 8 is a SAW beam sweeper in accordance with the invention.

FIG. 8 depicts a SAW beam sweeper 80, which is potentially useful in time-division multiplex systems, for example. Beam sweeper 80 is comprised of a body of crystalline material 81 of the type described above in connection with delay line 10, input transducer 82 and a plurality of output transducers 83, 84 and 85. Beam sweeper 80 also includes domains 81A–81C interfacing at domain walls 86 and 87. A pair of control electrodes 88 is associated with wall 86.

Body 81 is cut such that axis 89 of the beam sweeper is perpendicular to domain walls 86 and 87. This establishes $\phi$ of FIG. 5 at 45°. Since curves 51 and 52 intersect at this point, the acoustic waves launched by transducer 82 do not experience any change in velocity as they traverse the domain walls. However, since neither curve 51 nor curve 52 has a zero slope at this intersection point, the waves initiated at transducer 82 do not propagate along the device axis but rather at an angle thereto, $\eta$, known as the "power flow" angle.

The magnitude of the power flow angle is illustratively the same throughout the device. However, it has one sense, or polarity, with respect to the axis 89 in domains 81A and 81C and another in domain 81B. Varying the width of domain 81B by moving wall 86 by way of a signal applied to control lead 88a changes the respective positions at which the acoustic wave beam crosses walls 86 and 87. It thus determines which of the output transducers receives the beam. In particular, establishing wall 86 at its left-most, central and right-most positions illustratively directs the beam to output transducers 83, 84 and 85, respectively. In some applications of this device, the segmented electrode structure of FIG. 2 could be used to particular advantage in positioning wall 86.

A beam sweeping function such as that performed by beam sweeper 80 could also be provided, although less efficiently, by fabricating the device of FIG. 7 to have a single domain wall and by substituting a plurality of output transducers for transducer 73.

Figure 9:
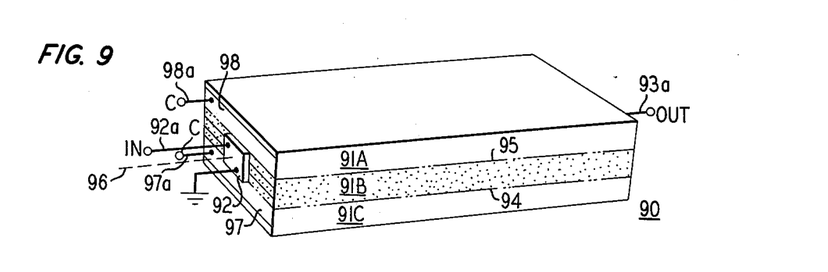
FIG. 9 is a guide for bulk acoustic waves in accordance with the invention.

FIG. 9 depicts a variable width waveguide 90 for bulk acoustic waves, in accordance with the invention. Waveguide 90 is comprised of body 91 of crystalline material of the type described above in connection with delay line 10, an input bulk acoustic wave transducer 92 which has an input lead 92A, and an output bulk acoustic wave transducer (not visible in FIG. 9) which has an output lead 93A. A pair of domain walls 94 and 95 define a domain, or channel 91B, in which the $c$ crystal axis is aligned with device axis 96.

The $a$ and $b$ crystal axes are interchanged between the outside regions 91A and 91C on the one hand and channel 91B, on the other.

Transducer 92 generates bulk acoustic waves in a shear mode in which the principal particle displacement is perpendicular to the direction of propagation, i.e., perpendicular to axis 96, and polarized along the $a$ crystal axis, for example. Illustratively, the velocity of such waves is lower than the particle displacement is polarized along the $a$ axis of the crystalline material than along the $b$ axis. This produces a well-known waveguide effect which contains the acoustic wave energy substantially within channel 91B. See, for example, Boyd et al U.S. Pat. No. 3,922,622 issued Nov. 25, 1975.

The width of channel 91B and thus, for example, the dispersion characteristic of the waveguide, can be varied by applying appropriate signals to electrode pairs 97 and 98 associated with domain walls 94 and 95 by way of control leads 97a and 98a, respectively. This capability may be found useful, for example, in filter and equalizer applications. In addition, the entire channel can be moved up or down, as viewed in FIG. 9 by the use of a more complex electrode structure such as the segmented structure described above in connection with FIG. 2.

As advantageous property not mentioned hereinabove of ferroelastic materials such as the rare-earth molybdates is that the application of pressure along the $b$ axis of a particular region of the crystal will cause an interchange of the $a$ and $b$ axes (and a reversal of the $c$ axis) in that region accompanied by nucleation (creation), destruction, and/or movement of domain walls within the body. This property is not necessary for the invention but is advantageous in that it facilitates fabrication of the devices disclosed herein.

In particular, a domain wall may be created in the crystalline body by first squeezing along the edges most nearly parallel to the device axis so as to orient the $b$ crystal axis along (or more closely along) the device axis throughout the body. The device should be immersed in a slightly conductive liquid at this time to allow the ferroelectric polarization charge to re-establish itself at a value consistent with the all-$b$ orientation. With the body still immersed, a corner of the body is pressed against a fixed object. This will nucleate a first domain wall near that corner. Continued pressure on the corner will cause the wall to propagate toward the center of the body to the desired location. The wall position can be monitored optically, as previously described. This process can be repeated as often as necessary to nucleate the number of domain walls desired. Once the body is removed from the conductive liquid, the domain walls will remain where they are positioned.

A precaution to be observed in utilizing these materials is that there is some physical deformation of the crystalline body as a domain wall is moved therethrough. To avoid damaging strains which might crack the device when in operation, it should be mounted such that the edges of any region of the crystalline body through which a domain wall passes must be free to move. Delay line 10, for example, must be mounted such that the region to the right of the left edge of electrodes 18 is free to move.

The principles of the present invention are applicable not only to surface acoustic wave devices, as thus far described, but also to bulk acoustic wave (BAW) devices in which the transducers are arranged such that acoustic waves propagate through the bulk of the crystalline material rather than at its surface. Among the BAW devices in which the invention can be implemented are delay lines such as disclosed, for example, in L. A. Coldren et al, "Surface-Wave Long Delay Lines", pp. 598–609 of above-cited publication. In addition, filter 70 in FIG. 7 hereof, for example, can easily be transformed into a BAW device by substituting BAW transducers for SAW transducers 72 and 73. Beam sweeper 80 can similarly be adapted for BAW operation. A particular advantage of implementing the invention in a BAW device is that the velocity difference for bulk acoustic waves along the $a$ and $b$ axes of materials such as the rare earth molybdates is greater than it is for surface acoustic waves, thereby providing a larger delay range.

Thus, it will be appreciated that although various embodiments of acoustic wave devices embodying the principles of our invention have been shown and described herein, numerous other arrangements may be devised by those skilled in the art without departing from the spirit and scope of the invention.

What is claimed is:

1. An acoustic wave device comprising
   a monolithic body of a crystalline material in which acoustic waves will propagate, said body including first and second regions which have differing crystal axis orientations and which interface at a planar domain wall,
   first transducing means disposed on said body and operative in response to an input signal for launching acoustic waves along a path which intersects said domain wall,
   second transducing means disposed on said body such that it receives at least a portion of the energy of said acoustic waves, said second transducing means providing an output signal in response to said received portion, and
   means responsive to a control signal for varying the location of said domain wall within said body,
   said control means including a pair of electrodes disposed on opposing surfaces of said body such that they intersect the plane of said domain wall and means for applying said control signal to said electrodes,
   at least one of said electrodes comprising a plurality of regions of alternating high and low impedance and said control signal applying means including means for applying first and second signals to a selected pair of said low impedance regions.

2. The invention of claim 1 wherein a first crystal axis within said body is oriented in a predetermined direction in said first region and a second crystal axis is oriented in said direction in said second region and wherein said crystalline material is such that the application of an electrical signal through the plane of said first and second axes in a portion of said body which includes said domain wall effects an interchange of said first and second axes immediately adjacent said domain wall.

3. The invention of claim 2 wherein the velocity of acoustic waves propagating along said path is different in said first and second regions.

4. An acoustic wave device including
   a monolithic body comprised of first, second and third regions of a crystalline material in which acoustic waves will propagate, said second region interfacing with said first and third regions at first and second planar domain walls, respectively;
   input transducing means responsive to an input signal for launching acoustic waves within said first region, said acoustic waves propagating along a path from said first region through said second region to said third region, the velocity of said acoustic waves along said path being different in said second region than in said first and third regions;
   output transducing means responsive to acoustic waves propagating within said third region for generating an output signal; and
   a pair of control electrodes, said electrodes being disposed on said body such that said first domain wall moves in first and second directions in response to the application of first- and second-polarity control signals, respectively, between said electrodes, and further such that said second domain wall does not move in response to the application of either said first- or second-polarity control signals between said electrodes.

5. The invention of claims 4 further comprising means for applying said control signals between said electrodes.

6. The invention of claim 4 wherein said body has a central longitudinal axis, wherein said first and third regions have a first crystal orientation with respect to said axis, and wherein said second region has a second crystal orientation with respect to said axis.

7. The invention of claim 6 further comprising means for applying said control signals between said electrodes.

8. The invention of claim 6 wherein said input and output transducing means are surface acoustic wave transducers, said acoustic wave device further including first and second surface acoustic wave reflectors disposed adjacent said input and output transducers, respectively, such that said device comprises an acoustic wave resonator.

9. The invention of claim 8 wherein said body further includes a fourth region of said crystalline material interfacing said third region at a third planar domain wall, and wherein at least one of said reflectors includes a plurality of grating lines, said device further including means for varying the location of said third domain wall such that the plane thereof intersects selected ones of said grating lines.

10. An acoustic wave device including
    a monolithic body comprised of first and second regions of a crystalline material in which acoustic waves will propagate, said regions having differing crystal orientations and interfacing at a domain wall;
    input transducing means responsive to an input signal for launching acoustic waves along a path which passes through said first and second regions, said acoustic waves propagating at different velocities along said path in said first and second regions;
    a surface acoustic wave grating disposed along said path in both said first and second regions, said grating being adapted to reflect acoustic waves within a predetermined wavelength band whereby acoustic waves within first and second frequency bands are reflected by the portions of said grating within said first and second regions, respectively;
    output transducing means disposed on said body such that it receives said reflected acoustic waves; and
    means responsive to a control signal for varying the distance between said domain wall and said input transducing means.

11. An acoustic wave device comprising
    a monolithic body of a crystalline material in which bulk shear mode acoustic waves polarized along first and second axes of said crystalline material will propagate at first and second velocities, respectively, said first velocity being smaller than said second velocity, said body having a central domain in which said first axis is aligned in a predetermined direction and a pair of outer domains in which said second axis is aligned in said predetermined direction, said central domain interfacing said outer domains at respective domain walls, means for launching in said central domain bulk shear mode acoustic waves polarized along said first axis, and means responsive to a control signal for varying the locations of said domain walls within said body.

12. An acoustic wave device comprising a monolithic body comprised of at least first and second regions of a crystalline material in which acoustic waves will propagate, said regions having differing crystal orientations and interfacing at at least a first domain wall;

input transducing means responsive to an input signal for launching acoustic waves along a path which intersects said domain wall, said domain wall comprising an impedance discontinuity for acoustic waves so that at least a portion of the energy of said acoustic waves is reflected at said domain wall;

output transducing means disposed on said body such that it receives at least a portion of said reflected energy; and means responsive to a control signal for varying the distance along said path between said domain wall and said input transducing means.

13. An acoustic wave device comprising a monolithic body of a crystalline material, said body including first and second regions in which acoustic waves propagate at different power flow angles and which interface at a domain wall;

an input transducer disposed on said body and operative in response to an input signal for launching acoustic waves within said first region such that said waves propagate across said domain wall into said second region;

means for establishing said domain wall at selected ones of a predetermined plurality of locations, said acoustic waves propagating along a different path for each of said locations; and a plurality of output transducers each disposed on said body across a different one of said paths.

14. An acoustic wave device comprising a monolithic body comprised of at least first and second regions of a crystalline material in which acoustic waves will propagate, said regions having differing crystal orientations and interfacing at a planar domain wall, input transducing means responsive to an input signal for launching acoustic waves along a path which intersects said domain wall, means including said domain wall for reflecting at least a portion of the energy of said acoustic waves, said reflecting means including means responsive to a control signal for varying the distance along said path between said input transducing means and said domain wall, and output transducing means disposed on said body such that it receives at least a portion of said reflected energy.

15. The invention of claim 14 wherein said varying means includes a pair of electrodes disposed on opposing surfaces of said body such that they intersect the plane of said domain wall and means for applying said control signal to said electrodes.

16. The invention of claim 15 wherein at least one of said electrodes comprises a plurality of regions of alternating high and low impedance and wherein said control signal applying means includes means for applying first and second signals to a selected pair of said low impedance regions.

17. The invention of claim 15 wherein a first crystal axis within said body in oriented in a predetermined direction in said first region and a second crystal axis is oriented in said direction in second region and wherein said crystalline material is such that the application of an electrical signal through the plane of said first and second axes in a portion of said body which includes said domain wall effects an interchange of said first and second axes immediately adjacent said domain wall.

18. The invention of claim 17 wherein said crystalline material is a rare earth molybdate.

* * * * *